United States Patent
Hung et al.

(10) Patent No.: US 9,455,725 B2
(45) Date of Patent: Sep. 27, 2016

(54) PHASE DETECTOR AND ASSOCIATED PHASE DETECTING METHOD

(71) Applicant: M31 Technology Corporation, Hsinchu County (TW)

(72) Inventors: Cheng-Liang Hung, Nantou County (TW); Chun-Cheng Lin, Hsinchu County (TW); Chih-Hsien Chang, Yilan County (TW); Chao-Hsin Fan Jiang, Hsinchu (TW)

(73) Assignee: M31 Technology Corporation, Hsinchu County (TW)

( * ) Notice: Subject to any disclaimer, the term of this patent is extended or adjusted under 35 U.S.C. 154(b) by 0 days.

(21) Appl. No.: 14/860,711

(22) Filed: Sep. 22, 2015

(65) Prior Publication Data
US 2016/0142061 A1    May 19, 2016

(30) Foreign Application Priority Data
Nov. 14, 2014  (TW) .............................. 103139632 A

(51) Int. Cl.
| H03H 11/16 | (2006.01) |
| H03L 7/081 | (2006.01) |
| H03K 5/01  | (2006.01) |
| H03K 5/00  | (2006.01) |

(52) U.S. Cl.
CPC ................ *H03L 7/081* (2013.01); *H03K 5/01* (2013.01); *H03K 2005/00286* (2013.01)

(58) Field of Classification Search
None
See application file for complete search history.

(56) References Cited

U.S. PATENT DOCUMENTS

| 6,686,777 | B1 * | 2/2004 | Karlquist ............... H03L 7/091 327/2 |
| 6,888,906 | B2 | 5/2005 | Muellner |
| 7,170,964 | B2 | 1/2007 | Kocaman |
| 7,310,397 | B2 * | 12/2007 | Smith .................. H04L 7/0331 327/141 |
| 2006/0002497 | A1 * | 1/2006 | Zhang .................. H03L 7/0814 375/355 |
| 2009/0002082 | A1 * | 1/2009 | Menolfi ................. H03L 7/085 331/57 |
| 2012/0049910 | A1 * | 3/2012 | Aoyama ................ H03L 7/089 327/156 |
| 2015/0188697 | A1 * | 7/2015 | Lin ........................ H03L 7/085 375/375 |
| 2015/0229298 | A1 * | 8/2015 | Tomita ..................... H03L 7/07 375/376 |
| 2016/0099718 | A1 * | 4/2016 | Shibasaki ............... H03L 7/085 327/155 |

FOREIGN PATENT DOCUMENTS

| CN | 102931982 A | 2/2013 |
| TW | I285025 | 8/2007 |

* cited by examiner

*Primary Examiner* — Cassandra Cox
(74) *Attorney, Agent, or Firm* — Winston Hsu; Scott Margo

(57) ABSTRACT

A phase detector includes a plurality of sampling circuits, a logic circuit, a plurality of demultiplexers and a decision circuit, wherein the plurality of sampling circuits use a plurality of clock signals with different phases to sample a data signal respectively to generate a plurality of sampling results; the logic circuit generate N phase-leading signals and N phase-lagging signals according the plurality of sampling results; the plurality of demultiplexers perform demultiplex operations to the N phase-leading signals and the N phase-lagging signals respectively to generate M phase-leading output signals and M phase-lagging output signals respectively; and the decision circuit generates a final phase-leading signal and a final phase-lagging signal according the M phase-leading output signals and the M phase-lagging output signals.

14 Claims, 12 Drawing Sheets

PHASE DETECTOR AND ASSOCIATED PHASE DETECTING METHOD

BACKGROUND OF THE INVENTION

1. Field of the Invention

The present invention relates to a phase detector, and more particularly, to a phase detector applied in a Clock and Data Recovery Circuit (CDR).

2. Description of the Prior Art

In the test of CDR, normally the Jitter Tolerance (JTOL) is tested to decide the ability of CDR. However, the JTOL of CDR is generally affected by some factors such like the type of data, the response time of circuit, the bandwidth of the CDR. For the type of data, the phase detector of traditional CDR can't immediately generate the corresponding phase-leading (early) signal or phase-lagging (late) signal for some specific types of the input data signal such like a plurality of consecutive "0"s or "1"s, so the speed of phase calibration of clock signal is thus delayed. In addition, for the response time of circuit, because a delay phenomenon may exist between circuits, the current direction of phase adjustment of the clock signal might be opposite to the true direction of phase adjustment, so the error of phase calibration might be caused by the phase adjustment.

SUMMARY OF THE INVENTION

The main objective of the present invention is to provide a phase detector, which can generate the corresponding phase-leading signal or phase-lagging signal immediately independent of the type of the input data signal, and if the current direction of phase adjustment of the clock signal is wrong, it can be corrected immediately to avoid the subsequent error of phase calibration, so as to solve the above-mentioned problems in prior art.

According to an embodiment of the present invention, a phase detector comprises a plurality of sampling circuit, a logic circuit, a plurality of demultiplexers and a decision circuit, wherein the plurality of sampling circuit use a plurality of clock signals with different phases to sample at least a data signal so as to generate a plurality of sampling results; the logic circuit is coupled to the plurality of sampling circuits, and arranged to generate N phase-leading signals and N phase-lagging signals according to the plurality of sampling results; the plurality of demultiplexers are coupled to the logic circuit, and arranged to perform demultiplex to the N phase-leading signals and N phase-lagging signals respectively so as to generate M phase-leading output signals and M phase-lagging output signals, wherein M is bigger than N and M is a positive integral multiples of N, and the frequencies of the M phase-leading output signals and M phase-lagging output signals are lower than the frequencies of the N phase-leading signals and N phase-lagging signals; and the decision circuit is coupled to the plurality of demultiplexers, and arranged to generate a final phase-leading signal and a final phase-lagging signal according to the M phase-leading output signals and M phase-lagging output signals.

According to another embodiment of the present invention, a phase detecting method comprises: using a plurality of clock signals with different phases to sample at least a data signal respectively to generate a plurality of sampling results; generating N phase-leading signals and N phase-lagging signals according to the plurality of sampling results; performing demultiplex to the N phase-leading signals and the N phase-lagging signals respectively to generate M phase-leading output signals and M phase-lagging output signals respectively, wherein M is bigger than N and M is a positive integral multiples of N, and the frequencies of the M phase-leading output signals and M phase-lagging output signals are lower than the frequencies of the N phase-leading signals and N phase-lagging signals; generating a final phase-leading signal and a final phase-lagging signal according to the M phase-leading output signals and M phase-lagging output signals.

According to another embodiment of the present invention, a phase detector comprises a plurality of sampling circuits, a logic circuit, a decision circuit and a detecting circuit, wherein the plurality of sampling circuits use a plurality of clock signals with different phases to sample at least a data signal to generate a plurality of sampling results; the logic circuit is coupled to the plurality of sampling circuits, and arranged to generate a plurality of phase-leading signals and a plurality of phase-lagging signals according to the plurality of sampling results; the decision circuit is coupled to the plurality of demultiplexers, and arranged to generate a final phase-leading signal and a final phase-lagging signal according to the plurality of phase-leading signals and a plurality of phase-lagging signals; and the detecting circuit is arranged to detect the phase relation between at least a data signal and a clock signal of the plurality of clock signals to generate a detecting result; wherein the decision circuit decides if the direction of phase adjustment of the at least a data signal is opposite to the direction of phase adjustment of a clock signal of the plurality of clock signals according to the detecting result, and decide if the final phase-leading signal and the final phase-lagging signal need to be adjusted accordingly.

According to another embodiment of the present invention, a phase detecting method comprises: using a plurality of clock signals with different phases to sample at least a data signal to generate a plurality of sampling results; generating a plurality of phase-leading signals and a plurality of phase-lagging signals according to the plurality of sampling results; generating a final phase-leading signals and a final phase-lagging signals according to the plurality of phase-leading signals and the plurality of phase-lagging signals; detecting the phase relation between at least a data signal and a clock signal of the plurality of clock signals to generate a detecting result; and deciding if the direction of phase adjustment of the at least a data signal is opposite to the direction of phase adjustment of a clock signal of the plurality of clock signals according to the detecting result, and deciding if the final phase-leading signal and the final phase-lagging signal need to be adjusted accordingly.

The objective (s) of the present invention will no doubt become obvious to those of ordinary skill in the art after reading the following detailed description of the preferred embodiment that is illustrated in the various figures and drawings.

DETAILED DESCRIPTION

Figure 1:
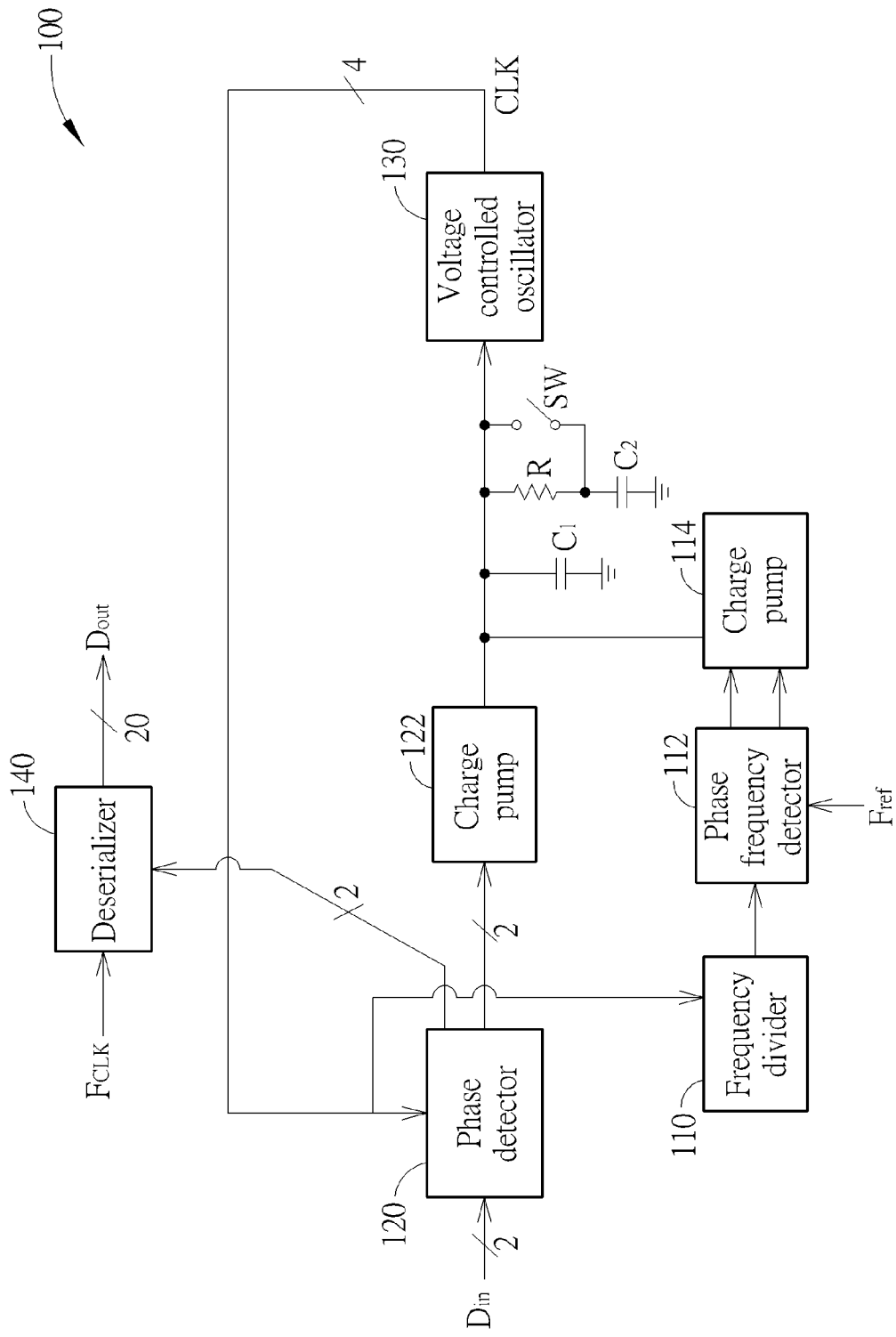
FIG. 1 is a diagram illustrating a clock and data recovery circuit according to an embodiment of the present invention.

Refer to FIG. 1, which is a diagram illustrating a clock and data recovery circuit (CDR) 100 according to an embodiment of the present invention. As shown in FIG. 1, the CDR 100 comprises a frequency divider 110, a phase frequency detector 112, a charge pump 114, a phase detector 120, a charge pump 122, a voltage controlled oscillator 130, a deserializer 140, a resistor R, two capacitors C1 and C2 and a switch SW. In the embodiments of the present invention, the phase detector 120 is a Bang-Bang phase Detector (BBPD, also called !!PD), and the CDR 100 is applied in the receiver of Universal Serial Bus (USB), but it's not a limitation of the present invention.

The operation of the CDR 100 is mainly for receiving a data signal $D_{in}$, and obtaining a clock signal from the data signal, and then using the clock signal to sample the data signal $D_{in}$ so as to generate a recovered data signal. More specifically, in the operation of the CDR 100, it mainly operates in two modes, i.e. phase-locked loop (PLL) mode and CDR mode. First of all, the CDR 100 operates in the PLL mode to make the clock signal CLK generated by the voltage controlled oscillator 130 can have the wanted frequency, at this time, the switch SW in FIG. 1 is off, and the frequency divider 110 receives the clock signal CLK generated by the voltage controlled oscillator 130 and performs frequency division operation upon the clock signal CLK, then the phase frequency detector 112 compares the frequency divided clock signal with a reference clock signal Fref to generate a comparison result to the charge pump 114, and the charge pump 114 based on the comparison result outputs current which passes through a resistor R and two capacitors C1 and C2 to generate a control voltage to the voltage controlled oscillator 130 so as to adjust the frequency of the clock signal CLK generated by the voltage controlled oscillator 130. The clock signal CLK generated by the voltage controlled oscillator 130 can have the wanted frequency via this loop.

Next, after locking the frequency, the frequency divider 110, the phase frequency detector 112 and the charge pump 114 don't need to work anymore, and at this time, the CDR 100 operates in CDR mode. In the CDR mode, the switch SW in FIG. 1 is on, and the phase detector 120 uses the clock signal CLK generated by the voltage controlled oscillator 130 to sample the data signal $D_{in}$, and generates a final phase-leading signal and a final phase-lagging signal according to the sampling result, and the charge pump 122 and a resistor R generate a control voltage to the voltage controlled oscillator 130 according to the phase-leading signal and the phase-lagging signal so as to slightly adjust the frequency of the generated clock signal CLK to lock the phase of the clock signal CLK and the data signal $D_{in}$ as possible. Meanwhile, the phase detector 120 can use suitable clock signal CLK to sample the data signal $D_{in}$ via this loop, and transmits this sampling result (this sampling result can be regarded as the recovered data signal) to the deserializer 140, and the deserializer 140 down converts the sampling result and transforms it into parallel data as output data $D_{out}$ according to the clock signal $F_{CLK}$. It should be noted that the main function of each component in the CDR 100 should be well known for skilled person in the art, therefore, the detailed operation is omitted herein.

In addition, for explaining conveniently, in this embodiment, the data signal $D_{in}$ is a differential signal, and the frequency of the data signal $D_{in}$ is 5 Gb/s, and the voltage controlled oscillator 130 generates four clock signals CLK with the same frequency but different phases which are 0, 90, 180, and 270 degrees respectively, wherein the clock signal CLK has a frequency of about 2.5 GHz, but this is not a limitation of the present invention. Moreover, in the following illustration, the CDR 100 is applied in the specification of USB 3.0, and according to the specification of USB 3.0, the data uses 8b/10b coding technique, the number of consecutive "0"s or "1"s in the data signal $D_{in}$ is not more than 5.

Figure 2:
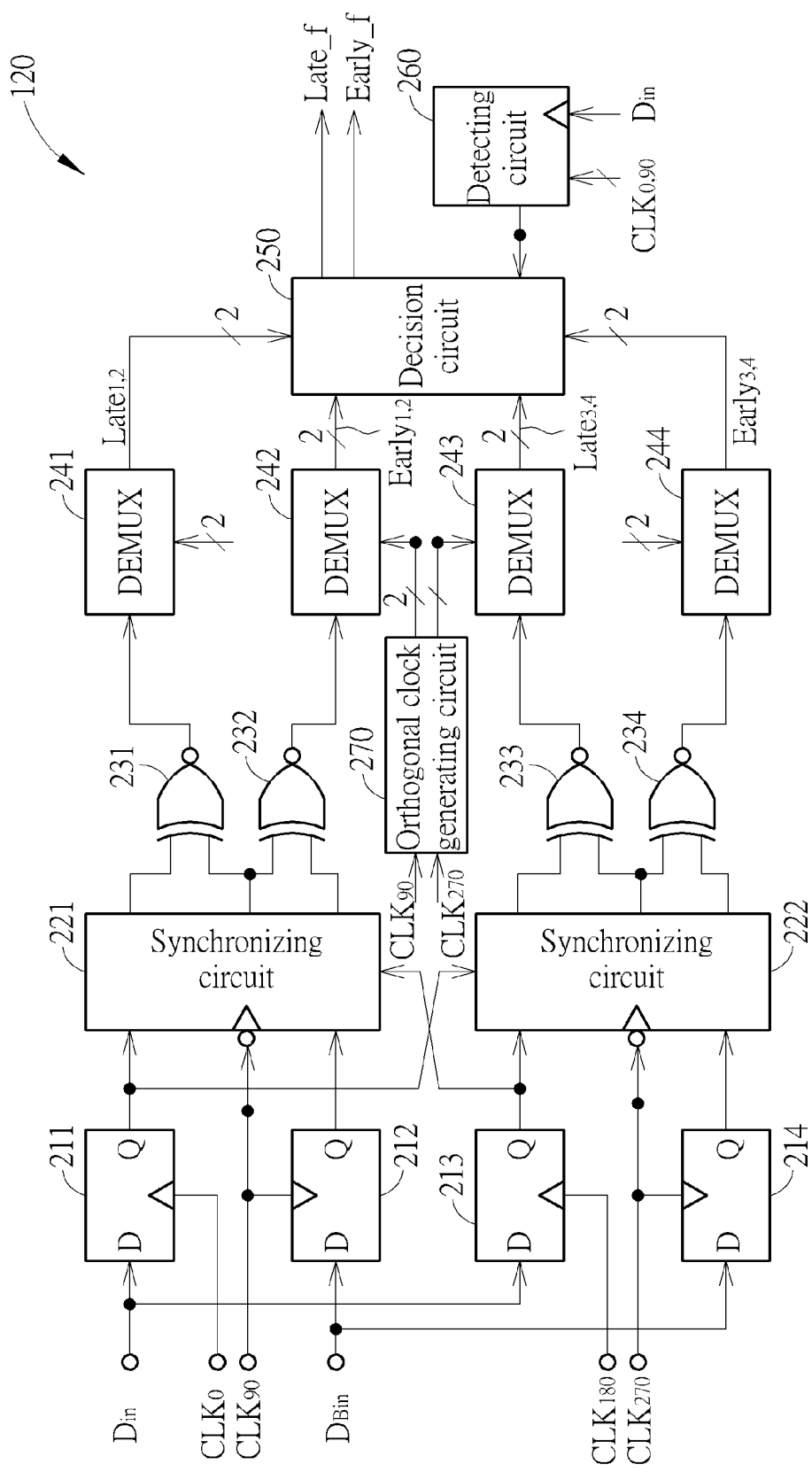
FIG. 2 is a diagram illustrating a phase detector according to an embodiment of the present invention.

Refer to FIG. 2, which is a diagram illustrating a phase detector 120 according to an embodiment of the present invention. As shown in FIG. 2, the phase detector 120 comprises a plurality of sampling circuit (in this embodiment, there are four flip flops 211, 212, 213 and 214), two synchronizing circuits 221 and 222, a logic circuit comprising four XNOR gates 231, 232, 233 and 234, four demultiplexers (DEMUX) 241, 242, 243 and 244, a decision circuit 250, a detecting circuit 260 and a orthogonal clock generating circuit 270. Wherein, in FIG. 2, $D_{in}$ and $D_{Bin}$ corresponds to the data signal $D_{in}$ shown in FIG. 1, and the $D_{Bin}$ is the inverse signal of $D_{in}$; in addition, $CLK_0$, $CLK_{90}$, $CLK_{180}$ and $CLK_{270}$ are clock signals with the same frequency having different phases of 0, 90, 180, and 270 degrees respectively outputted by the voltage controlled oscillator 130.

In the operation of phase detector 120, first, the flip flop 211 uses the clock signal $CLK_0$ to sample the data signal $D_{in}$, the flip flop 212 uses the clock signal $CLK_{90}$ to sample the data signal $D_{Bin}$, the flip flop 213 uses the clock signal $CLK_{180}$ to sample the data signal $D_{Bin}$, and the flip flop 214 uses the clock signal $CLK_{270}$ to sample the data signal $D_{Bin}$.

Next, the synchronizing circuit 221 uses the inverse signal of the clock signal $CLK_{90}$, i.e. the clock signal $CLK_{270}$, to synchronize the sampling results outputted by the flip flops 211, 212 and 213, then outputs the sampling results to the XNOR gates 231 and 232; and the synchronizing circuit 222 uses the inverse signal of $CLK_{270}$, i.e. the clock signal $CLK_{90}$, to synchronize the sampling results outputted by the flip flops 211, 213 and 214, then outputs to the XNOR gates 233 and 234.

Next, the XNOR gates 231 and 232 generate a phase-lagging signal and a phase-leading signal respectively according to the sampling results outputted by the flip flops 211, 212 and 213, and the XNOR gates 233 and 234 generate a phase-lagging signal and a phase-leading signal based on the sampling results outputted by the flip flops 211, 213 and 214. More specifically, the phase-lagging signal outputted by the XNOR gate 231 is "1" and the phase-leading signal outputted by the XNOR 232 is "0" when the level of the input signal $D_{in}$ is "0", "1", "1" or "1", "0", "0" corresponding to the sampling point of the clock signal $CLK_0$, $CLK_{90}$ and $CLK_{180}$ (when the sampling results outputted by the flip flops 211, 212 and 213 are "0", "0", "1" or "1", "1", "0" respectively) to indicate the phase of the clock signal CLK behinds the data signal $D_{in}$; on the other hand, the phase-lagging signal outputted by the XNOR gate 231 is "0" and the phase-leading signal outputted by the XNOR 232 is "1" when the level of the input signal $D_{in}$ is "0", "0", "1" or "1", "1", "0" corresponding to the sampling point of the clock signal $CLK_0$, $CLK_{90}$ and $CLK_{180}$ (when the sampling results outputted by the flip flops 211, 212 and 213 are "0", "1", "1" or "1", "0", "0" respectively) to indicate that the phase of the clock signal CLK leads the data signal $D_{in}$. Likewise, the operations and the meanings of the XNOR gates 233 and 234 are similar to the abovementioned statements about XNOR gates 231 and 232.

It should be noted that the output of the XNOR gates 231 and 232 both are "0" when the level of the input signal $D_{in}$ is "0", "0", "0" or "1", "1", "1" corresponding to the sampling point of the clock signal $CLK_0$, $CLK_{90}$ and $CLK_{180}$, at this time, the sampling results outputted by the flip flops 211, 212 and 213 are "0", "1", "0" or "1", "0", "1" respectively, which means at this time, the phase relation between the clock signal CLK and the data signal $D_{in}$ can't be identified or recognized.

In addition, the plurality of sampling circuits (i.e. the flip flops 211, 212, 213 and 214) and logic circuit (i.e. XNOR gates 231, 232, 233 and 234) shown in FIG. 2 are for illustrative purposes only, in the situation that can obtain the same result, the plurality of sampling circuit and the logic circuit can be implemented by other circuits, and these alternative designs should fall within the scope of this invention.

Next, when the data signal $D_{in}$ shows two to five consecutive "1"s or "0"s, the outputs of the abovementioned XNOR gates 231 and 232 are all "0", and it results in the problem that the phase relation between the clock signal CLK and the data signal $D_{in}$ can't be identified. To solve the abovementioned problem, DEMUXs 241, 242, 243 and 244 respectively use the clock signals generated by the orthogonal clock generating circuit 270 to demultiplex the outputs of the XNOR gates 231, 232, 233 and 234 so as to generate four phase-leading output signals and four phase-lagging output signals so as to make sure that the phase relation between the clock signal CLK and the data signal $D_{in}$ can be identified at any time interval in order to make the clock and the CDR 100 keep phase adjustment.

More specifically, after the orthogonal clock generating circuit 270 down converts the frequency of the clock signal $CLK_{90}$ by half, two inverse clocks (in this embodiment, the frequency is 1.25 GHz) are generated to the DEMUXs 241 and 242, and after the orthogonal clock generating circuit 270 down converts the frequency of the clock signal $CLK_{270}$ by half, two inverse clocks (in this embodiment, the frequency is 1.25 Gb/s) are generated to the DEMUXs 243 and 244. Next, the DEMUX 241 receives the phase-lagging signal outputted by the XNOR gate 231 and performs demultiplex operation to generate two sets of phase-lagging output signals $Late_1$ and $Late_2$ with the same frequency 1.25 Gb/s; the DEMUX 242 receives the phase-leading signal outputted by the XNOR gate 232 and performs demultiplex operation so as to generate two sets of phase-leading output signals $Early_1$ and $Early_2$ with the same frequency 1.25 Gb/s; the DEMUX 243 receives the phase-lagging signal outputted by the XNOR gate 233 and performs demultiplex operation so as to generate two sets of phase-lagging output signals $Late_3$ and $Late_4$ with the same frequency 1.25 Gb/s; and the DEMUX 244 receives the phase-leading signal outputted by the XNOR gate 234 and performs demultiplex operation so as to generate two sets of phase-leading output signals $Early_3$ and $Early_4$ with the same frequency 1.25 Gb/s.

Next, the decision circuit 250 generates a final phase-leading signal Early_f and a final phase-lagging signal Late_f according to the phase-lagging output signals $Late_1$, $Late_2$, $Late_3$ and $Late_4$ and the phase-leading output signals $Early_1$, $Early_2$, $Early_3$ and $Early_4$. In this embodiment, at every moment, the decision circuit 250 makes final phase-lagging signal Late_f "1" and the final phase-leading signal Early_f "0", as long as any one of the phase-lagging output signals $Late_1$, $Late_2$, $Late_3$ and $Late_4$ is "1"; likewise, the decision circuit 250 makes the final phase-lagging signal Late_f "0" and the final phase-leading signal Early_f "1", as long as any one of the phase-leading output signals $Early_1$, $Early_2$, $Early_3$ and $Early_4$ is "1". In addition, in some situations, the decision circuit 250 can stop outputting the final phase-leading signal Early_f and the final phase-lagging signal Late_f to prevent error in case that the phase-lagging output signal and the phase-leading output signal both show "1" in the same time.

Figure 3:
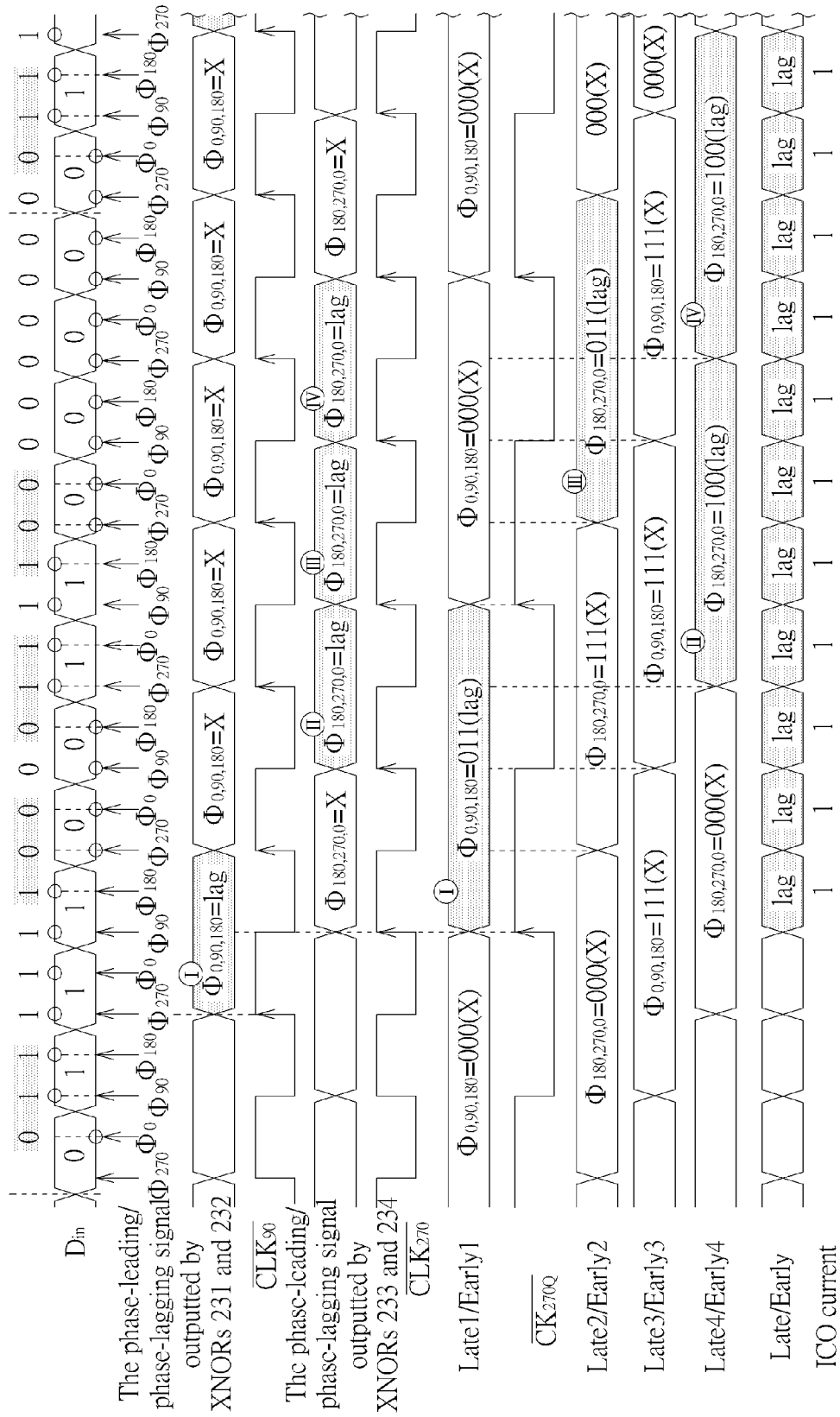
FIG. 3 is a timing diagram illustrating a portion of signals shown in FIG. 2 according to an embodiment of the present invention.

In order to describe the operations of FIG. 2 better, refer to FIG. 3, which is a timing diagram for illustrating a portion of signals shown in FIG. 2 according to an embodiment of the present invention. In FIG. 3, assuming that the data signal $D_{in}$ is "0111100110000011" sequentially, the XNOR gates 231 and 232 output the phase-lagging signal whose logic value is "1" in the time interval marked as "I" in FIG. 3, and in other time intervals, both the XNOR gates 231 and 232 can't decide the relation of phase-leading/lagging (i.e. the phase-leading/lagging signals outputted by the XNOR gates 231 and 232 are both "0"); and at this time, the XNOR gates 233 and 234 can only output the phase-lagging signal whose logic value is "1" in the time intervals marked as "II", "III" and "IV", and in other time intervals, both the XNOR gates 233 and 234 can't decide the relation of phase-leading/lagging (i.e. the phase-leading/lagging signals outputted by the XNOR gates 233 and 234 are both "0"). As shown in FIG. 3, because in some time intervals such as the interval between the intervals marked as "I" and "II", and the interval after the interval marked as "IV", all the XNOR gates 231, 232 and the XNOR gates 233 and 234 can't decide the relation of phase-leading/lagging, therefore, if the outputs of the XNOR gates 231, 232 and the XNOR gates 233, 234 are directly used to control the operation of the back end voltage controlled oscillator 130, the voltage controlled oscillator 130 can't keep adjusting the phase of the output clock signal constantly and the speed of phase calibration of the clock signal is delayed thereby.

Therefore, the generated phase-lagging output signals $Late_1$, $Late_2$, $Late_3$ and $Late_4$ and phase-leading output signals $Early_1$, $Early_2$, $Early_3$ and $Early_4$ can cover all the time intervals (e.g. the intervals marked as "I", "II", "III" and "IV" in FIG. 3 corresponding to the abovementioned intervals marked as "I", "II", "III" and "IV" in the outputs of the XNOR gates 231, 232, 233 and 234 respectively) via the down conversion of the DEMUXs 241, 242, 243 and 244, that is, no matter in which interval, the decision circuit 250 can receive the information about "phase lag", and the generated final phase-lagging signal Late_f is being "1" constantly to control the current of the Current-Controlled Oscillator (ICO) in the voltage controlled oscillator 130 to make the ICO current can charge constantly and make the voltage controlled oscillator 130 keep adjusting the phase of the output clock signal, and speed up the phase calibration of the clock signal. In addition, as shown in FIG. 3, to indicate that the charge/discharge of the ICO current performs speeding up/slowing down the clock frequency to the ICO in the voltage controlled oscillator 130 conveniently, the charge of the ICO current is normalized to "1" (speed up the clock frequency), the discharge of the ICO current is normalized to "−1" (slow down the clock frequency) and the ICO current keeps still "0" (maintain the clock frequency).

In addition, for the tidiness, FIG. 3 only depicts one of the clock signals $\overline{CK_{270Q}}$ generated by the orthogonal clock generating circuit 270, but the skilled person in the art should realize the orthogonal clock generating circuit 270 generates other clock signals with different phases to demultiplex the outputs of the XNOR gates 231,232 and the XNOR gates 233, 234 to obtain the phase-lagging output signals $Late_1$, $Late_2$, $Late_3$ and $Late_4$ and the phase-leading output signals $Early_1$, $Early_2$, $Early_3$ and $Early_4$.

Figure 4A:
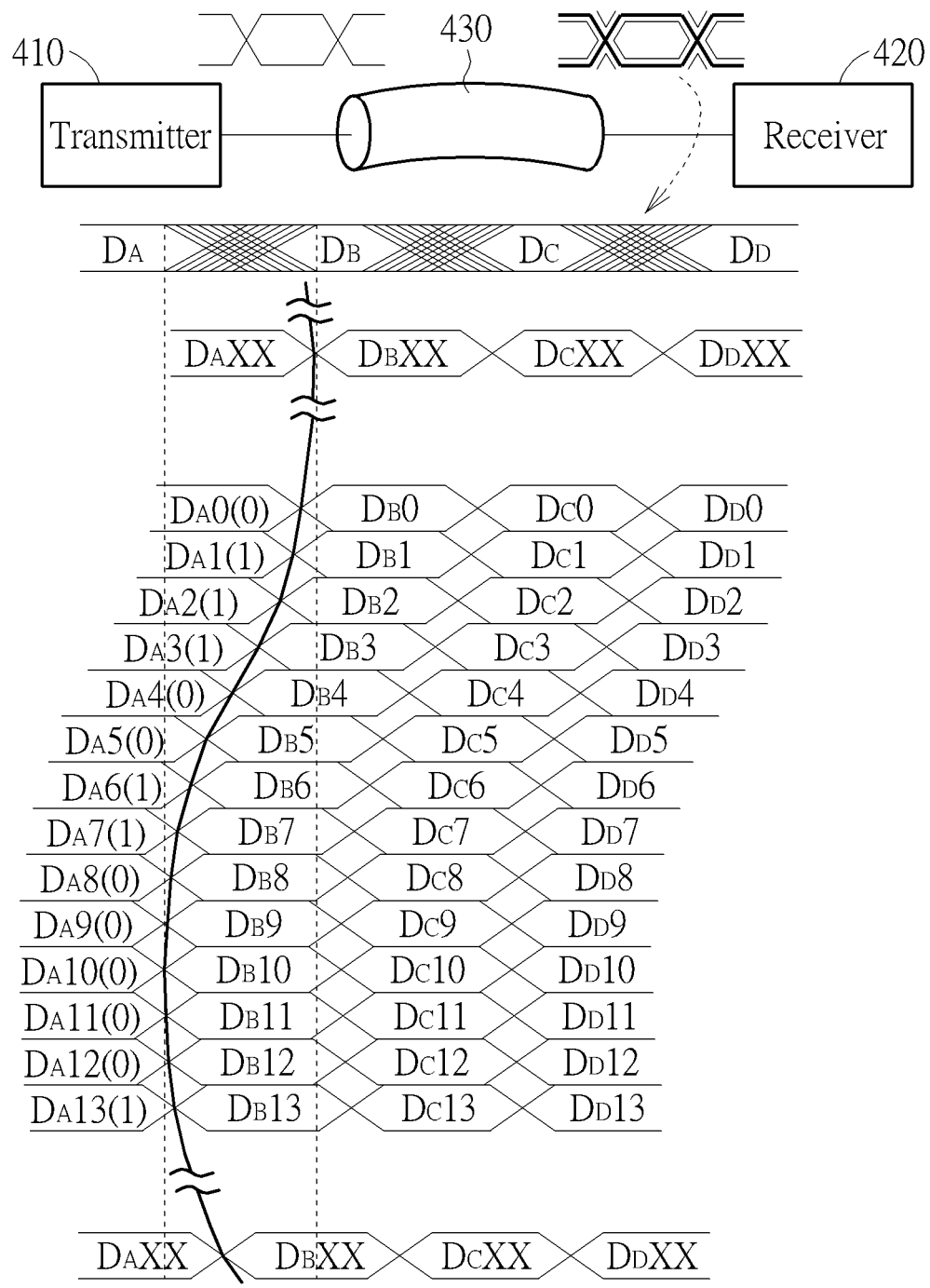
FIG. 4A is a diagram illustrating the testing signal used by the clock and data recovery circuit during the test.
Figure 4B:
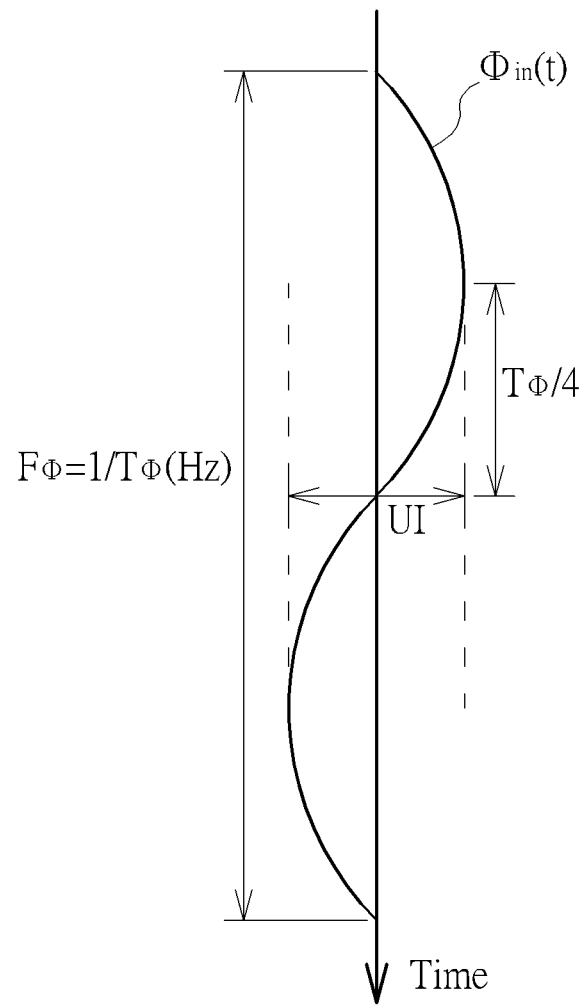
FIG. 4B is a diagram illustrating phase jitter modulation.

Refer to FIG. 4A, which is a diagram illustrating the testing signal used by the CDR 100 during the test. As shown in FIG. 4A, because the CDR 100 is implemented in the receiver 420, and the data signal from the transmitter 410 occurs signal jitter/distortion after passing the transmission line 430, therefore, to test if the CDR 100 has enough ability to recover the data signal, a testing signal is used to simulate a data signal with phase jitter, and the testing signal is inputted to the CDR 100 before leaving factory for testing the ability of recovering. FIG. 4A depicts the diagram of testing signal, wherein $D_AXX$, $D_BXX$, $D_CXX$ and $D_DXX$ represent each bit of the data signal respectively, the phase jitter modulation $\phi_{in}$ (t) of the testing signal is a sine wave. FIG. 4B depicts the diagram of the phase jitter modulation, wherein a period of the sine wave is marked as $T_\phi$, the modulation frequency of the sine wave $F_\phi$ is the data jitter frequency of the data signal, the peak and the wave trough is the data jitter amplitude of the data signal. The units of the frequency and the amplitude of the data jitter are Hz and UI respectively, wherein UI is Unit Interval of one bit of the data signal here.

Figure 5:
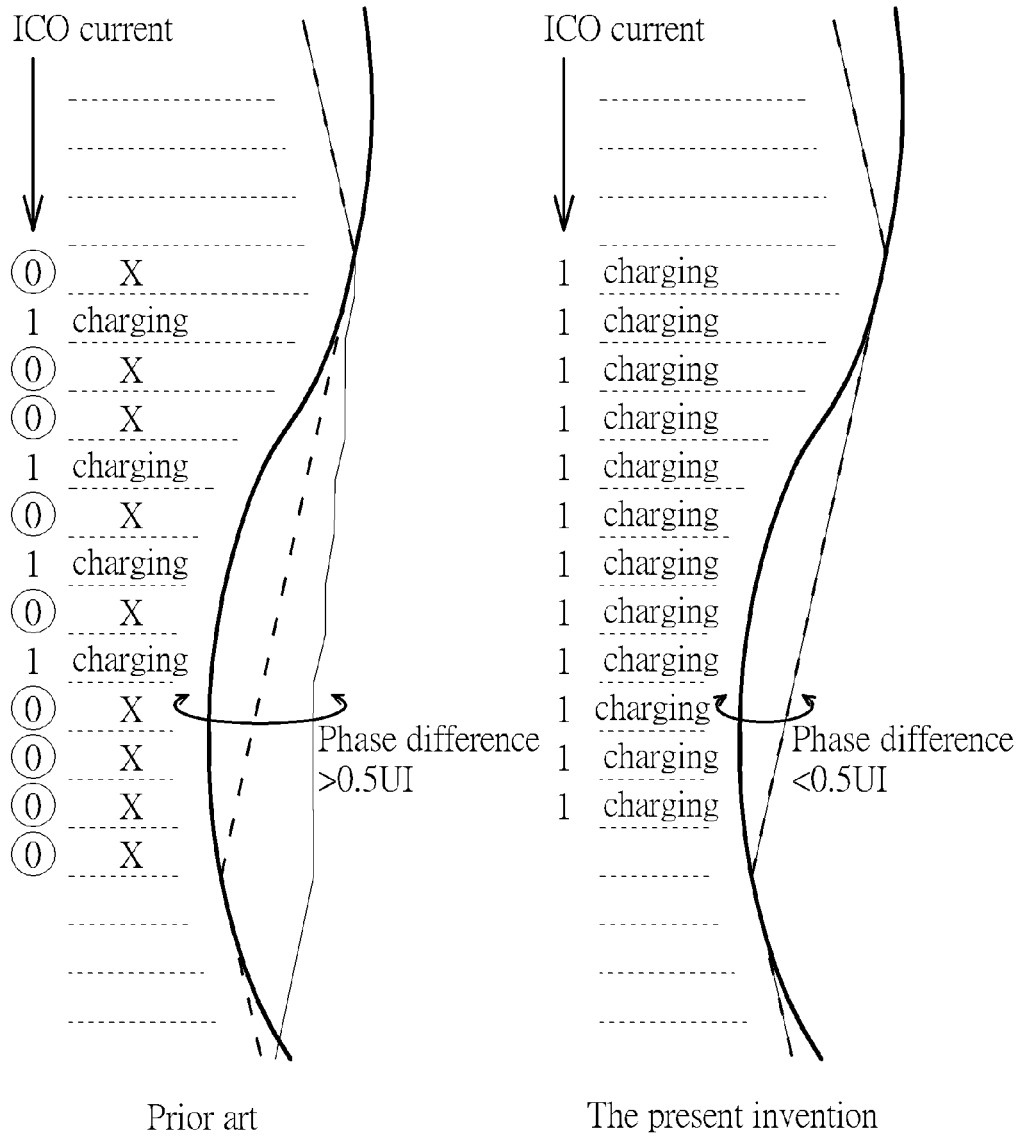
FIG. 5 is a diagram illustrating the phase tracking of clock signal of the present invention and the prior art.

Refer to FIG. 5, which is a diagram illustrating the phase tracking of clock signal of the present invention and prior art, in which assume the phase jitter frequency of the data signal is very fast, therefore, the phase of the clock signal can't catch up the variation of phase jitter of the data signal entirely, ideally the slewing rate of the clock signal is thus a straight line shown in FIG. 5, that is, that phase of the clock signal is transformed into a slash shown in FIG. 5. As described above in FIG. 2 and FIG. 3, in the prior art, sometimes the phase detector can't identify the phase relation between the clock signal and the data signal, so makes the ICO current can't charge/discharge constantly, that is the voltage controlled oscillator 130 cannot adjust the phase of the output clock signal constantly. Therefore, the phase difference between the data signal and the clock signal may over 0.5 UI, which makes the phase detector misjudge the relation of the phase-leading/lagging and the Bit Error Rate (BER) decreases, so the maximum jitter tolerance test can't be reached. Otherwise, in the present invention, because the phase detector 120 outputs the information about the phase-leading/lagging to back end anytime, therefore, the ICO current can charge/discharge constantly to make the voltage controlled oscillator 130 adjust the phase of the output clock signal, so makes the phase difference between the data signal and the clock signal within 0.5 UI, thereby the phase jitter amplitude of the input data signal is enhanced to reach the maximum jitter tolerance test.

As described above, no matter what kind of the data signal is, the phase detector 120 of the present invention can output the information about the phase-leading/lagging constantly to the back end, and makes the voltage controlled oscillator 130 able to keep adjusting the phase of the output clock signal constantly, therefore, the phase of the clock signal is close to the phase of the ideal clock signal shown in FIG. 5, i.e. data is independent with the slewing rate of the clock phase, so the speed of phase calibration of the clock signal can rise up, and the testing request can be satisfied even when the data jitter frequency of the data signal is very high.

It should be noted that in the abovementioned embodiments, assume the CDR 100 is applied in the specification of USB 3.0, and according to the specification of USB 3.0, the number of consecutive "0"s or "1"s in the data signal $D_{in}$ can't be over 5, therefore, in the phase detector 120, it only needs to down convert the frequency of the phase-leading/lagging signal outputted by the logic circuit via the DEMUXs 241, 242, 243 and 244 by half again (i.e. the frequency of each phase-leading/lagging output signal outputted by the DEMUXs 241, 242, 243 and 244 is a quarter of the frequency of the data signal $D_{in}$) to make the phase detector 120 able to output the information of phase-leading/lagging constantly to the back end. However, if the CDR 100 receives the data signal $D_{in}$ whose specification allows more consecutive "0"s or "1"s, the DEMUXs 241, 242, 243 and 244 can down convert the phase-leading/lagging signal outputted by the logic circuit more to make the detector circuit 120 able of output the information of phase-leading/lagging to the back end constantly. More specifically, assuming that the DEMUXs 241, 242, 243 and 244 output M phase-leading output signals and M phase-lagging output signals in total, and in this embodiment, the frequencies of these phase-leading/lagging output signals are 1/M of the frequency of the data signal $D_{in}$, then the CDR 100 can be applied in the specification which allows (2*M−1) consecutive "0"s or "1"s is (2*M−1) most to make the phase detector 120 able to output the information of phase-leading/lagging to back end constantly. In other words, when a specification allows K consecutive "1"s or "0"s, the number M of the phase-leading/lagging signal outputted by the DEMUXs 241, 242, 243 and 244 must be bigger than (K/2), so the phase detector 120 can output information of phase-leading/lagging to the back end constantly. In this embodiment, because M equals to 4, the maximum of K is 7.

Figure 6:
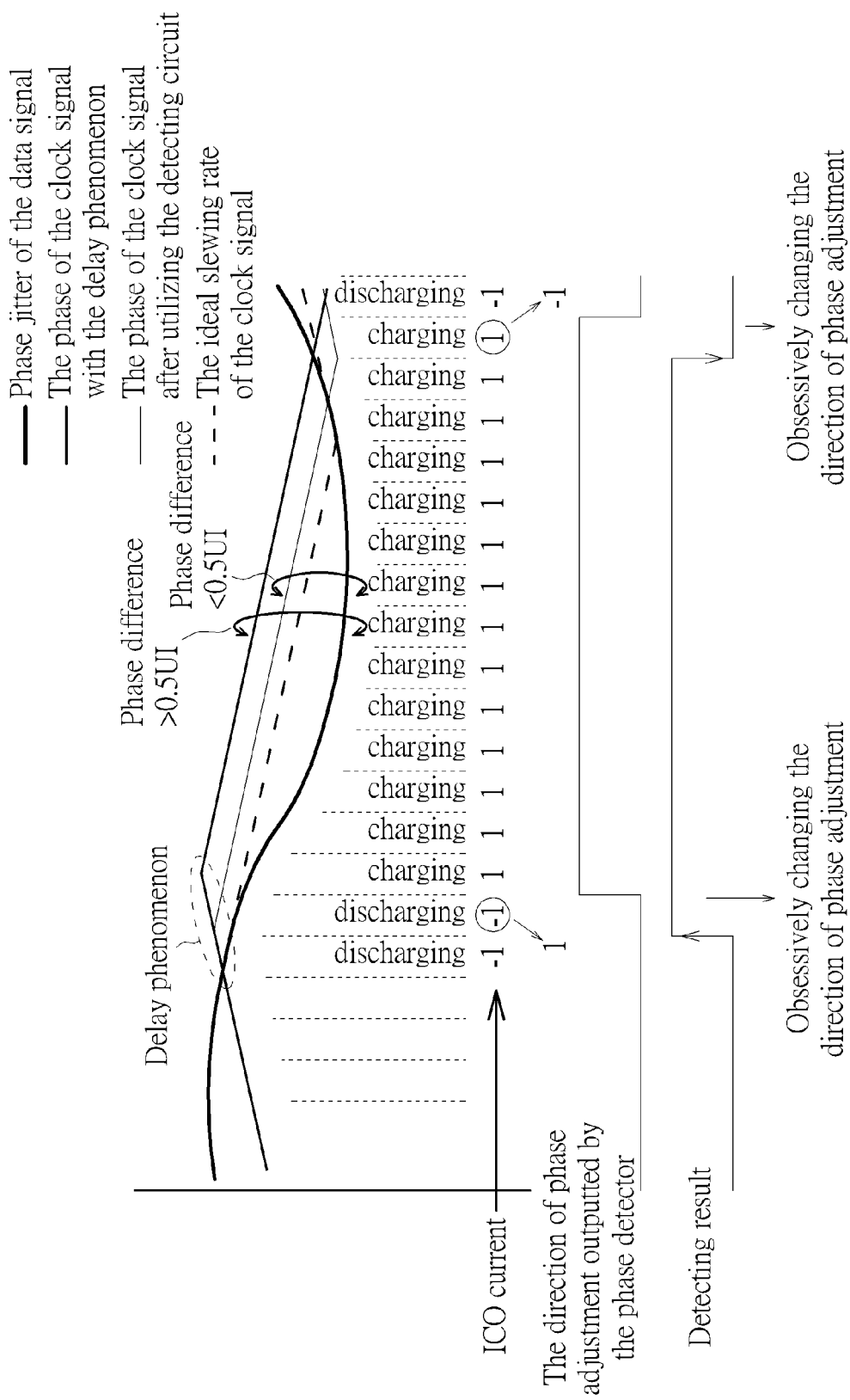
FIG. 6 is a diagram illustrating the phase relation between clock signal and data signal in practice.

On the other hand, the phase relation between the clock signal and the data signal of the present invention shown in FIG. 5 is an ideal status. The practical situation is shown in FIG. 6. The direction of phase adjusting of the data signal is opposite to the direction of phase adjusting of the clock signal due to the loop delay phenomenon shown in FIG. 2. Therefore, in the phase detector 120 in FIG. 2, the detecting circuit 260 is further arranged to detect the phase relation between the data signal $D_{in}$ and the clock signal to generate a detecting result $V_{cal}$. Next, the decision circuit 250 decides if the direction of phase adjustment of the data signal $D_{in}$ is opposite to the direction of phase adjustment of the clock signal according to the detecting result Vcal, and decides if the final phase-leading signal Early_f and the final phase-lagging signal Late_f need to be adjusted accordingly. More specifically, as shown in FIG. 6, the original direction of phase adjustment outputted by the phase detector 120 is opposite to the direction of phase adjustment of the data signal due to the factor of loop delay phenomenon, i.e. the charge/discharge of the ICO current doesn't fit the practical request and causes the phase difference between the data signal and the clock signal might be over 0.5 UI, therefore, the decision circuit 250 can change the output of the decision circuit 250 obsessively when it finds that the direction of phase adjustment of the data signal is opposite to the direction of phase adjustment of the clock signal via the detecting signal $V_{cal}$ generated by the detecting circuit 260 to avoid the phase difference between the data signal and the clock signal being over 0.5 UI shown in FIG. 6.

Figure 7:
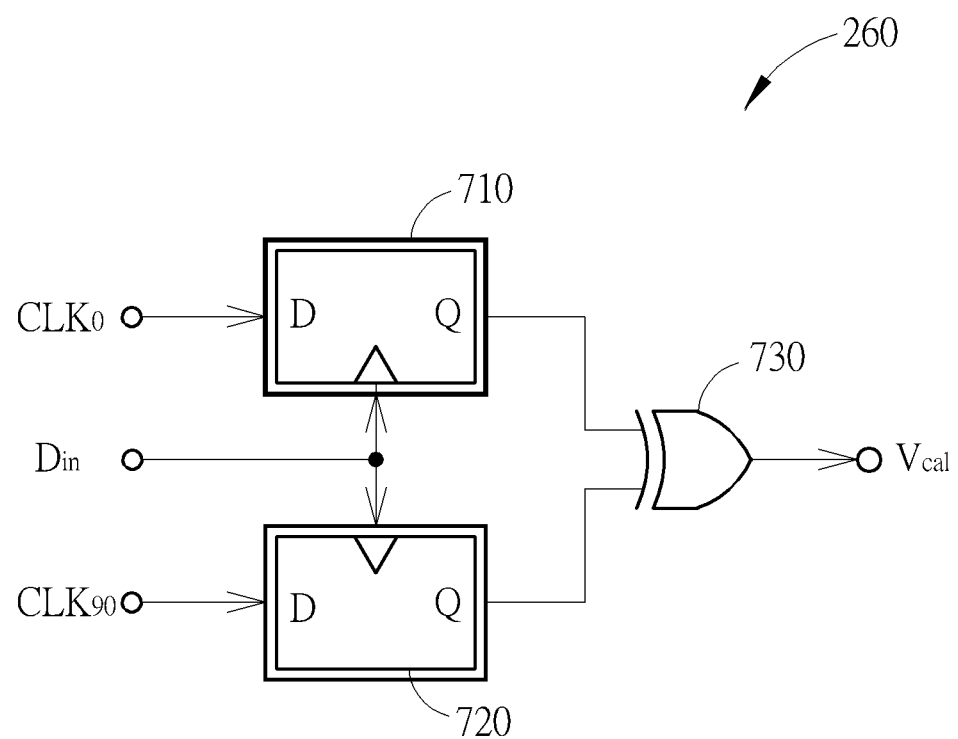
FIG. 7 is a diagram illustrating a detecting circuit according to the present invention.

More specifically, refer to FIG. 7, which is a diagram illustrating the detecting circuit 260 according to the present invention. As shown in FIG. 7, the detecting circuit 260 comprises two double edge triggered D-type flip flops 710 and 720 and a XOR gate 730, wherein the D-type flip flop 710 uses the data signal $D_{in}$ to sample the clock signal $CLK_0$, and the D-type flip flop 720 uses the data signal $D_{in}$ to sample the clock signal $CLK_{90}$, and the XOR gate 730 generates the detecting result $V_{cal}$ according to the sampling results of the D-type flip flops 710 and 720.

Figure 8:
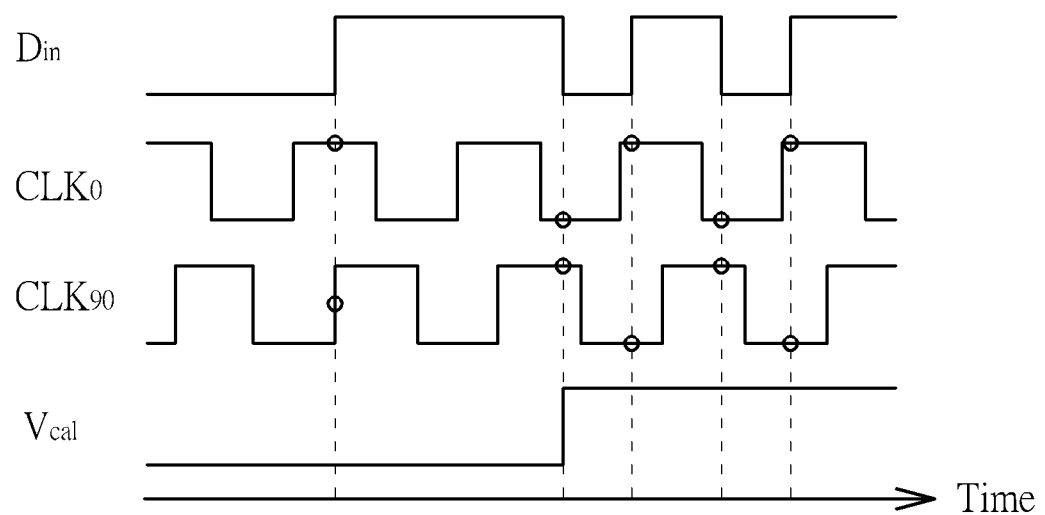
FIG. 8 is diagram illustrating the operation of detecting circuit at the moment the frequency of the data signal is twice as fast as the frequency of the clock signal.
Figure 9:
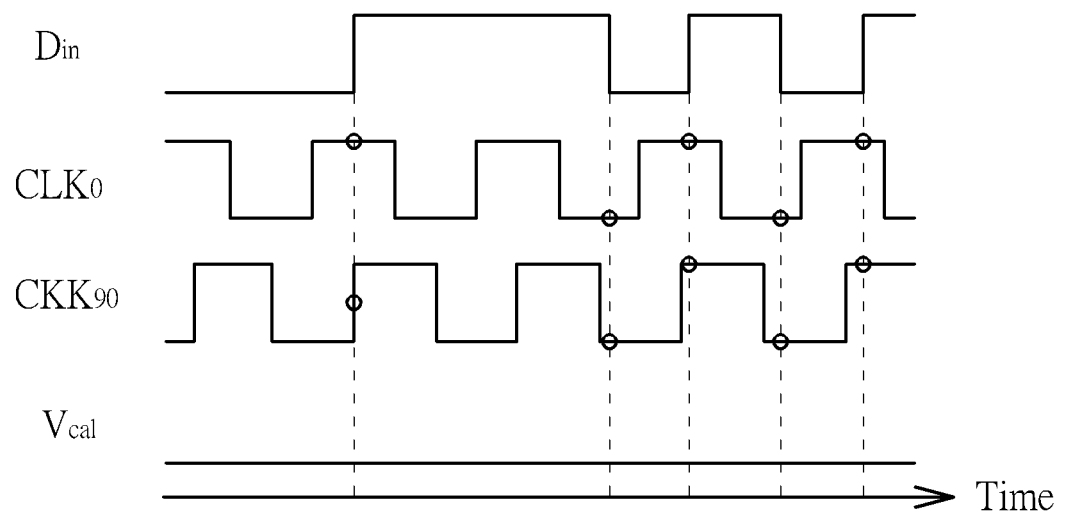
FIG. 9 is a diagram illustrating the operation of detecting circuit at the moment the frequency of the data signal is slower than twice the frequency of the clock signal.

Refer to FIG. 8 and FIG. 9, wherein FIG. 8 is diagram illustrating the operation of detecting circuit at the moment the frequency of the data signal starts to be faster than twice the frequency of the clock signal ($CLK_0$ and $CLK_{90}$), and FIG. 9 is a diagram illustrating the operation of detecting circuit at the moment the frequency of the data signal starts to be slower than twice the frequency of the clock signal. For FIG. 8, in this embodiment, because at the moment the frequency of the data signal is faster than twice the frequency of the clock signal, that is, the width of each bit of the data signal is getting smaller, at this time, the sampling results from the D-type flip flips 710 and 720 using the data signal $D_{in}$ to sample the clock signals $CLK_0$ and $CLK_{90}$ respectively are opposite logic values, and the detecting result $V_{cal}$ outputted by the XOR gate 730 is logic value "1" to indicate that the ICO current is on charging mode, therefore, if the direction of phase adjustment outputted by the phase detector 120 is to make the ICO current on discharging mode, then the decision circuit 250 obsessively changes the direction of phase adjustment to make the ICO current on charging mode; likewise, for FIG. 9, in this embodiment, because at the moment the frequency of the data signal is slower than twice the frequency of the clock signal, that is, the width of each bit of the data signal is getting bigger, at this time, the sampling results from the D-type flip flops 710 and 720 using data signal $D_{in}$ to sample the clock signals $CLK_0$ and $CLK_{90}$ are the same logic value, and the detecting result $V_{cal}$ outputted by the XOR gate 730 is logic value "0" to indicate that the ICO current is on discharging mode, therefore, if the direction of phase adjustment outputted by the phase detector 120 is to make the ICO current on charging mode, then the decision circuit 250 obsessively changes the direction of phase adjustment to make the ICO current on charging mode.

As described above, the loop delay phenomenon can be reduced via the operation of the detecting circuit 260. Under the testing conditions of high data jitter frequency and big data jitter amplitude of the data signal, the phase detector calibrates the clock phase normally via the CDR to make the phase difference between the data signal and the clock signal within 0.5 UI to reach the maximum jitter tolerance test. In the same time, it should be noted that the architecture and the operation of the detecting circuit 260 in FIG. 7 to FIG. 9 are for illustrative purposes only, the detecting circuit 260 can also be implemented by other circuit architectures, these alternative designs should fall within the scope of this invention.

It should be noted that, the phase detector 120 shown in FIG. 2 is only an example, not a limitation of the present invention. In other embodiments of the present invention, the detecting circuit 260 in FIG. 2 can be removed the phase detector 120, that is, the decision circuit 250 generates the final phase-leading signal Early_f and the final phase-lagging signal Late_f only according to the outputs of the DEMUXs 241, 242, 243 and 244. And in another embodiment of the present invention, the DEMUXs 241, 242, 243 and 244 and the orthogonal clock generating circuit 270 can be removed from the phase detector 120, and the decision circuit 250 generates the final phase-leading signal Early_f and the final phase-lagging signal Late_f according to the outputs of the XNOR gates 231, 232, 233 and 234 and the detecting result $V_{cal}$ of the detecting circuit 260. The above alternative design should fall within the scope of this invention.

Figure 10:
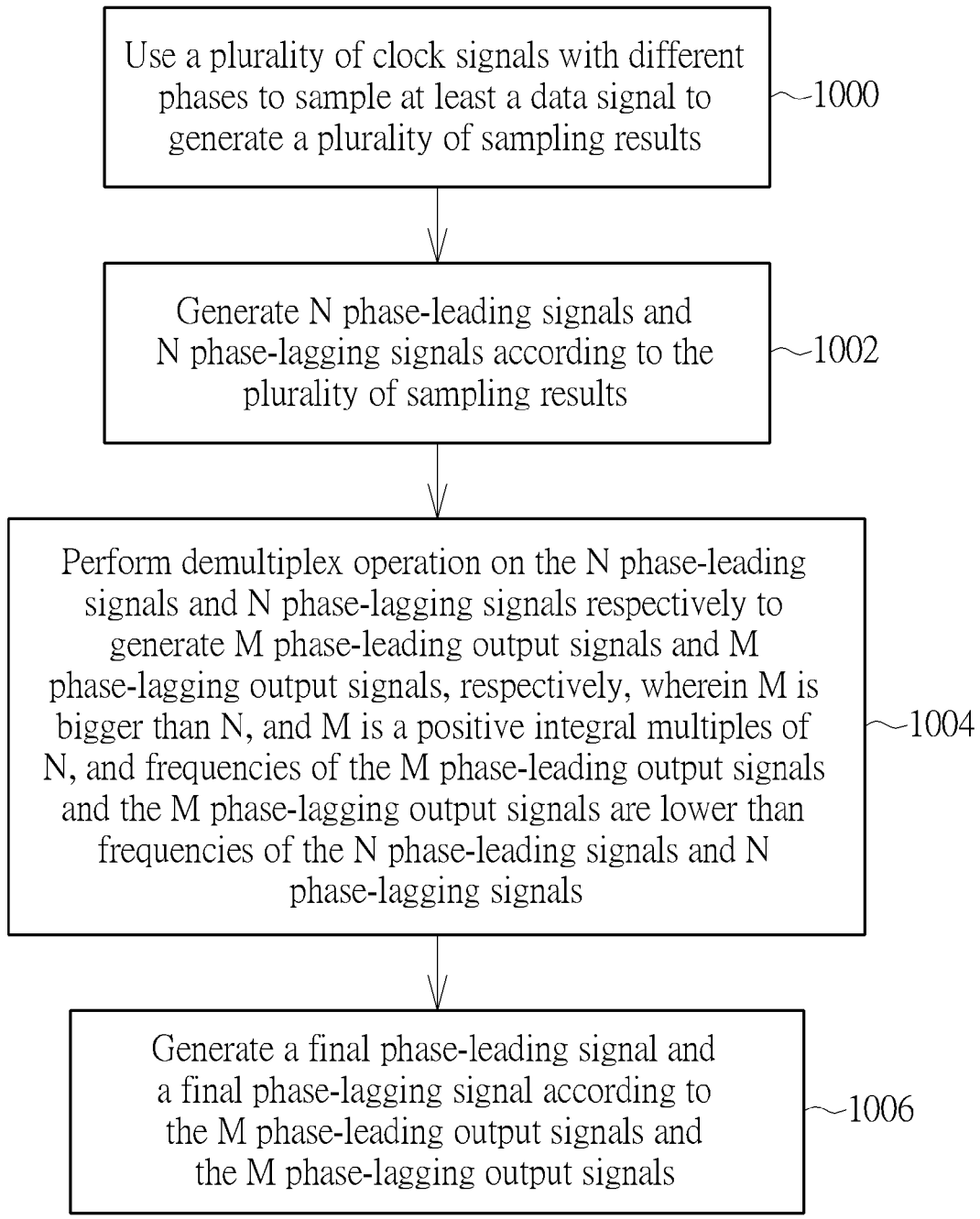
FIG. 10 is a flowchart illustrating a phase detecting method according to an embodiment of the present invention.

Refer to FIG. 10, which is a flowchart illustrating a phase detecting method according to an embodiment of the present invention. Refer to the above statement about the phase detector 120 in FIG. 2. The flow of phase detecting method is described as follows.

Step 1000: use a plurality of clock signals with different phases to sample at least a data signal to generate a plurality of sampling results.

Step 1002: generate N phase-leading signals and N phase-lagging signals according to the plurality of sampling results.

Step 1004: perform demultiplex operation on the N phase-leading signals and N phase-lagging signals respectively to generate M phase-leading output signals and M phase-lagging output signals, respectively, wherein M is bigger than N, and M is a positive integral multiples of N, and frequencies of the M phase-leading output signals and the M phase-lagging output signals are lower than frequencies of the N phase-leading signals and N phase-lagging signals.

Step 1006: generate a final phase-leading signal and a final phase-lagging signal according to the M phase-leading output signals and the M phase-lagging output signals.

Figure 11:
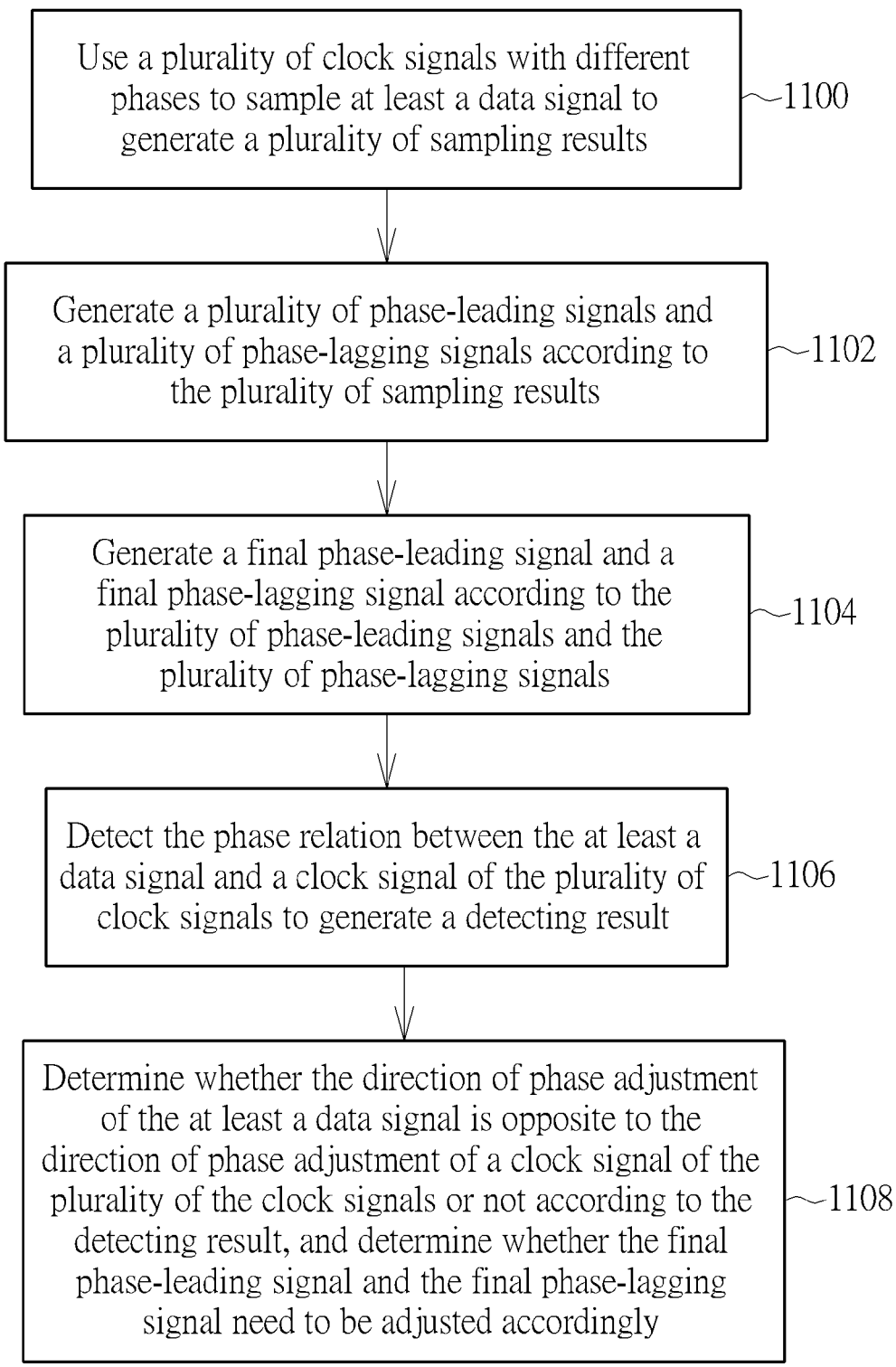
FIG. 11 is a flowchart illustrating a phase detecting method according to another embodiment of the present invention.

Refer to FIG. 11, which is a flowchart illustrating a phase detecting method according to another embodiment of the present invention. Refer to the above statement about the phase detector 120 in FIG. 2, the flow of the phase detecting method is described as follows.

Step 1100: use a plurality of clock signals with different phases to sample at least a data signal to generate a plurality of sampling results.

Step 1102: generate a plurality of phase-leading signals and a plurality of phase-lagging signals according to the plurality of sampling results.

Step 1104: generate a final phase-leading signal and a final phase-lagging signal according to the plurality of phase-leading signals and the plurality of phase-lagging signals.

Step 1106: detect the phase relation between the at least a data signal and a clock signal of the plurality of clock signals to generate a detecting result.

Step 1108: determine whether the direction of phase adjustment of the at least a data signal is opposite to the direction of phase adjustment of a clock signal of the plurality of the clock signals or not according to the detecting result, and determine whether the final phase-leading signal and the final phase-lagging signal need to be adjusted accordingly.

Briefly summarized, in the phase detector and associated phase detecting method of the present invention, the method of down converting the phase-leading/lagging signal via demultiplexer is used to make the phase detector able to generate the information of phase-leading/lagging to the back end voltage controlled oscillator constantly to make the voltage controlled oscillator able to keep adjusting the phase of the output clock signal. Therefore, the phase detector doesn't stop generating the information of the phase-leading/lagging due to the type of the data signal, so the data is independent with the slewing rate of the clock signal outputted by the voltage controlled oscillator, so the phase calibration of the clock signal can rise up and the testing request can be satisfied when the frequency of the testing signal is very high. Moreover, in another embodiment, the information of the phase-leading/lagging outputted by the phase detector can be decided if it has error via the detecting result of the detecting circuit to calibrate the direction of phase adjustment in advance to avoid the phase difference between the data signal and the clock signal being too big.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A phase detector, comprising:
    a plurality of sampling circuits, for respectively using a plurality of clock signals with different phases to sample at least a data signal so as to generate a plurality of sampling results;
    a logic circuit, coupled to the plurality of sampling circuits, and configured to generate N phase-leading signals and N phase-lagging signals according to the plurality of sampling results;
    a plurality of demultiplexers, coupled to the logic circuit, and configured to perform demultiplex operations on the N phase-leading signals and the N phase-lagging signals so as to generate M phase-leading output signals and M phase-lagging output signals, respectively, wherein M is bigger than N, M is a positive integral multiples of N, and frequencies of the M phase-leading output signals and the M phase-lagging output signals are lower than frequencies of the N phase-leading signals and N phase-lagging signals; and
    a decision circuit, coupled to the plurality of demultiplexers, and configured so as to generate a final phase-leading signal and a final phase-lagging signal according to the M phase-leading output signals and the M phase-lagging output signals.

2. The phase detector of claim 1, wherein the frequencies of the M phase-leading output signals and the M phase-lagging output signals are determined by a maximum number of consecutive logic "1"s or a maximum number of consecutive logic "0"s that allowed to be existed in the at least a data signal.

3. The phase detector of claim 2, wherein the frequencies of the M phase-leading output signals and the M phase-lagging output signals are (1/M) of a frequency of the at least a data signal, and when the maximum number of consecutive logic "1"s or the maximum number of consecutive logic "0"s that allowed to be existed in the at least a data signal is K, M is any integer number bigger than (K/2).

4. The phase detector of claim 1, wherein the plurality of the sampling circuits are four sampling circuits, the plurality of the clock signals are four clock signals with different phases, a frequency of the at least a data signal is twice than a frequency of the plurality of clock signals, N is two, M is four, and the frequencies of the M phase-leading output signals and the M phase-lagging output signals are a quarter of the frequency of the at least a data signal.

5. The phase detector of claim 1, further comprising:
    a detecting circuit, arranged to detect a phase relation between the at least a data signal and a clock signal of the plurality of clock signals to generate a detecting result;
    wherein the decision circuit determines whether a direction of phase adjustment of the at least a data signal is opposite to a direction of phase adjustment of the a clock signal of the plurality of clock signals or not according to the detecting result, and determines whether the final phase-leading signal and the final phase-lagging signal need to be adjusted accordingly.

6. The phase detector of claim 5, wherein the detecting circuit uses the at least a data signal to sample two clock signals of the plurality of clock signals to generate the detecting result.

7. A phase detecting method, comprising:
    using a plurality of clock signal with different phases to sample at least a data signal to generate a plurality sampling result;
    generating N phase-leading signals and N phase-lagging signals according to the plurality of sampling results;
    performing demultiplex operations on the N phase-leading signals and N phase-lagging signals to generate M phase-leading output signals and M phase-lagging output signals, wherein M is bigger than N, M is a positive integral multiples of N, and frequencies of the M phase-leading output signals and the M phase-lagging output signals are lower than frequencies of the N phase-leading signals and N phase-lagging signals; and
    generating a final phase-leading signal and a final phase-lagging signal according to the M phase-leading output signals and the M phase-lagging output signals.

8. The phase detecting method of claim 7, wherein the frequencies of the M phase-leading output signals and the M phase-lagging output signals are determined by a maximum number of consecutive logic "1"s or a maximum number of consecutive logic "0"s that allowed to be existed in the at least a data signal.

9. The phase detecting method of claim 8, wherein the frequencies of the M phase-leading output signals and the M phase-lagging output signals are (1/M) of a frequency of the at least a data signal, and when the maximum number of consecutive logic "1"s or the maximum number of consecutive logic "0"s that allowed to be existed in the at least a data signal is K, M is any integer number bigger than (K/2).

10. The phase detecting method of claim 7, wherein the plurality of the sampling circuits are four sampling circuits, the plurality of the clock signals are four clock signals with different phases, a frequency of the at least a data signal is twice than a frequency of the plurality of clock signals, N is two, M is four, and the frequencies of the M phase-leading output signals and the M phase-lagging output signals are a quarter of the frequency of the at least a data signal.

11. The phase detecting method of claim 7, further comprising:
    detecting a phase relation between the at least a data signal and a clock signal of the plurality of clock signals to generate a detecting result; and
    determining whether a direction of phase adjustment of the at least a data signal is opposite to a direction of phase adjustment of a clock signal of the plurality of clock signals or not according to the detecting result, and determining whether the final phase-leading signal and the final phase-lagging signal need to be adjusted accordingly.

12. The phase detecting method of claim 11, wherein the step of generating the detecting result comprises:
  using the at least a data signal to sample two clock signals of the plurality of clock signals to generate the detecting result.

13. A phase detecting method, comprising:
  using a plurality of clock signals with different phases to sample at least a data signal to generate a plurality of sampling results;
  generating a plurality of phase-leading signals and a plurality of phase-lagging signals according to the plurality of sampling results;
  generating a final phase-leading signal and a final phase-lagging signal according to the plurality of phase-leading signals and the plurality of phase-lagging signals;
  detecting a phase relation between the at least a data signal and a clock signal of the plurality of clock signals to generate a detecting result; and
  determining whether a direction of phase adjustment of the at least a data signal is opposite to a direction of phase adjustment of a clock signal of the plurality of clock signals or not according to the detecting result, and determining whether the final phase-leading signal and the phase-lagging signal need to be adjusted accordingly.

14. The phase detecting method of claim 13, wherein the step of generating the detecting result comprises:
  using the at least a data signal to sample two clock signals of the plurality of clock signals to generate the detecting result.

* * * * *